(12) United States Patent
Kwon

(10) Patent No.: US 10,186,686 B2
(45) Date of Patent: Jan. 22, 2019

(54) APPARATUS FOR USE AS BOTH MIRROR AND DISPLAY

(71) Applicant: LG DISPLAY CO., LTD., Seoul (KR)

(72) Inventor: OhNam Kwon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 73 days.

(21) Appl. No.: 15/334,652

(22) Filed: Oct. 26, 2016

(65) Prior Publication Data

US 2017/0117505 A1  Apr. 27, 2017

(30) Foreign Application Priority Data

Oct. 27, 2015 (KR) ........................ 10-2015-0149155

(51) Int. Cl.
*G02F 1/15* (2006.01)
*G09G 3/19* (2006.01)
*G02F 1/1335* (2006.01)
*G02F 1/155* (2006.01)
*G02F 1/157* (2006.01)
(Continued)

(52) U.S. Cl.
CPC .......... *H01L 51/5271* (2013.01); *G02F 1/155* (2013.01); *G02F 1/157* (2013.01); *H01L 27/3232* (2013.01); *G02F 1/133555* (2013.01); *G02F 1/15* (2013.01); *G02F 2001/133557* (2013.01); *G02F 2201/44* (2013.01); *G09G 3/19* (2013.01)

(58) Field of Classification Search
CPC .. G09G 3/19; G09G 3/38; G09G 3/18; G09G 3/3433; G09G 3/36; G09G 3/30; G09G 3/32; G09G 3/3208; F21V 14/003; G02F 2001/1512; G02F 2001/1515; G02F 2001/151; G02F 1/15–1/163; G02F 2001/1502–2001/1504; H01L 27/3232; C09K 9/00
USPC ................ 359/245, 265, 237, 242, 267–275; 345/49, 105, 30, 33, 48, 84; 348/816, 348/817, 739, 805, 808, 815; 349/114
See application file for complete search history.

(56) References Cited

U.S. PATENT DOCUMENTS

2004/0201802 A1* 10/2004 Ha ........................ G02F 1/1335
349/114
2008/0238828 A1* 10/2008 Nakayama ................ G09F 9/35
345/76

(Continued)

*Primary Examiner* — Cara E Rakowski
*Assistant Examiner* — Alberto J Betancourt
(74) *Attorney, Agent, or Firm* — Morgan, Lewis & Bockius LLP

(57) ABSTRACT

An apparatus for use as both a mirror and a display includes a first substrate; a plurality of organic light emitting elements arranged on the first substrate to define a plurality of sub-pixels; a separation layer on the organic light emitting elements; an optical unit on the separation layer, the optical unit including a plurality of reflective electrodes in an area corresponding to at least one sub-pixel, an electrochromic layer on the reflective electrodes, and an electrode layer disposed on the electrochromic layer; and a second substrate on the optical unit. If an electric field is applied to the organic light emitting elements and the optical unit, the apparatus operates in a display mode. If an electric field is not applied to the organic light emitting elements and the optical unit, the apparatus operates in a mirror mode.

24 Claims, 14 Drawing Sheets

(51) Int. Cl.
*H01L 27/32* (2006.01)
*H01L 51/52* (2006.01)

(56) References Cited

U.S. PATENT DOCUMENTS

| | | | |
|---|---|---|---|
| 2008/0316573 A1* | 12/2008 | Shim | G02F 1/155 359/265 |
| 2012/0081775 A1* | 4/2012 | Ersman | G02F 1/155 359/270 |
| 2014/0168745 A1* | 6/2014 | Satou | G02F 1/163 359/266 |

* cited by examiner

APPARATUS FOR USE AS BOTH MIRROR AND DISPLAY

This application claims priority of Korean Patent Application No. 10-2015-0149155, filed on Oct. 27, 2015, which is hereby incorporated by reference for all purposes as if fully set forth herein.

BACKGROUND

Field of the Invention

The present invention relates to an apparatus for use as both a mirror and a display.

Description of the Related Art

A mirror typically functions to reflect a light incident from the outside and transmit the light to a user. Each mirror has its own optical properties, such as reflectivity. In general, a mirror having a high reflectivity reflects most of the light incident from the outside to be transmitted to a user, whereas a mirror having a low reflectivity reflects only a part of the light incident from the outside to be transmitted to a user.

Meanwhile, a display apparatus typically includes a plurality of pixels, and each of the pixels emits a light having a specific wavelength or intensity so that a user can recognize an image displayed on the display apparatus.

In recent years, an apparatus has been suggested for use as both a mirror and a display by combining a mirror and a display apparatus. The apparatus would show the properties of the mirror when the display apparatus is in an OFF state using a Dual Brightness Enhanced Film (DBEF) bonded to a front surface of a TFT LCD. However, a DBEF is very expensive, and the surface roughness of the DBEF may cause distortion of a mirror image. Further, when the display apparatus is in an ON state, a visual brightness (in a bright room) is decreased, and thus, an image quality of display considerably deteriorates. When the display apparatus is in an OFF state, the apparatus has a dark mirror visibility due to a low reflectivity.

SUMMARY

Accordingly, the present invention is directed to an apparatus for use as both a mirror and a display that substantially obviates one or more of the problems due to limitations and disadvantages of the related art.

An object of the present invention is to provide an apparatus for use as both a mirror and a display capable of achieving reduced unit cost, realizing a high-reflectivity mirror without distortion of a mirror image, and realizing a high image quality of display.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an apparatus for use as both a mirror and a display comprises a first substrate; a plurality of organic light emitting elements arranged on the first substrate to define a plurality of sub-pixels; a separation layer on the organic light emitting elements; an optical unit on the separation layer, the optical unit including a plurality of reflective electrodes in an area corresponding to at least one sub-pixel, an electrochromic layer on the reflective electrodes, and an electrode layer disposed on the electrochromic layer; and a second substrate on the optical unit, wherein, if an electric field is applied to the organic light emitting elements and the optical unit, the apparatus operates in a display mode, and wherein, if an electric field is not applied to the organic light emitting elements and the optical unit, the apparatus operates in a mirror mode.

In another aspect, an apparatus for use as both a mirror and a display comprises a first substrate; a plurality of organic light emitting elements arranged on the first substrate to define a plurality of sub-pixels; a separation layer on the organic light emitting elements; a plurality of reflective electrodes on the separation layer and disposed in an area corresponding to at least one sub-pixel; an electrochromic layer disposed on the reflective electrodes; an electrode layer disposed on the electrochromic layer; and a second substrate disposed on the electrode layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
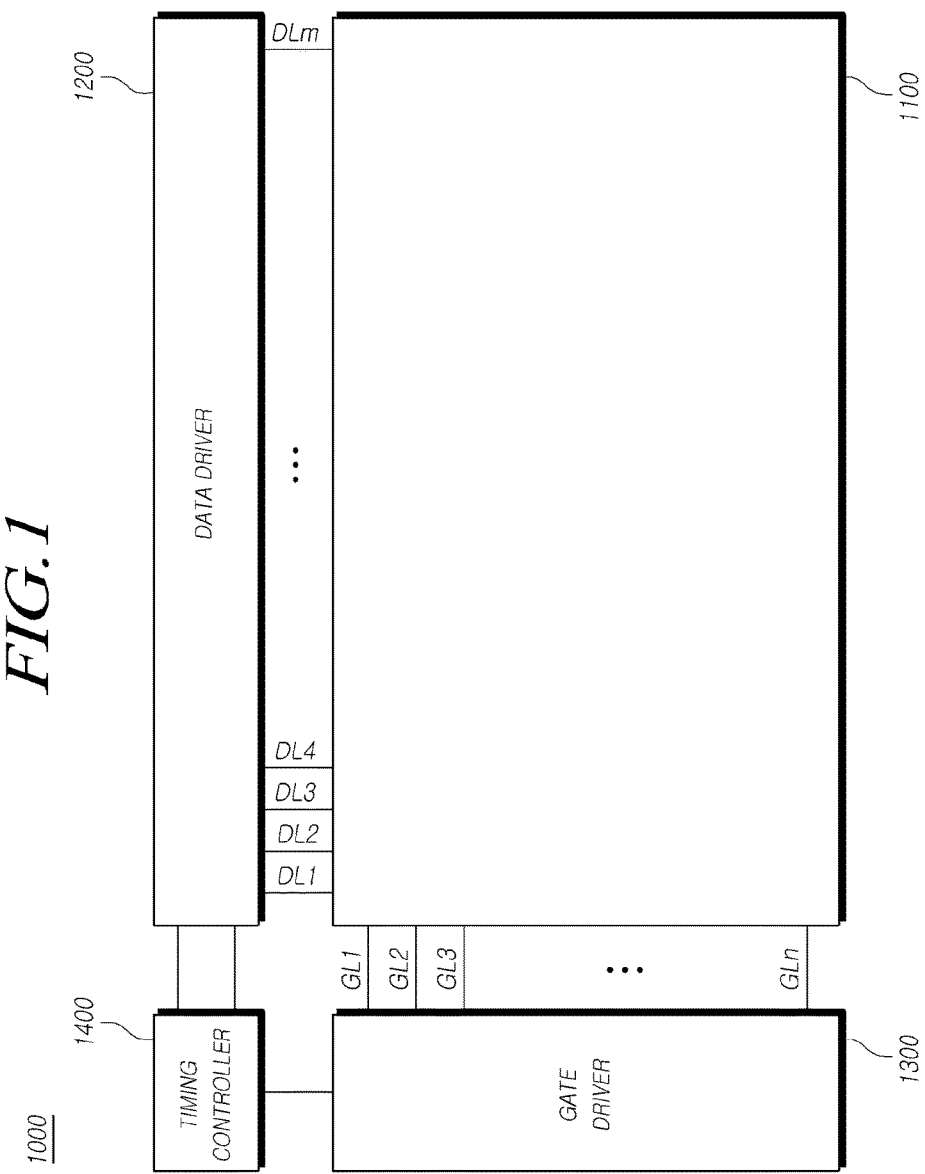
FIG. 1 is a system configuration view of a transparent display apparatus according to example embodiments.

Reference will now be made in detail to the preferred embodiments of the present invention, examples of which are illustrated in the accompanying drawings. Exemplary embodiments introduced hereinafter are provided as examples. Therefore, the present disclosure is not limited to the following exemplary embodiments and can be embodied into different shapes and configurations. Also, the size and thickness of the device might be expressed to be exaggerated for the sake of convenience in the drawings. Like reference numerals generally denote like elements throughout the present specification.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims. Like reference numerals generally denote like elements throughout the present specification. In the drawings, the sizes and relative sizes of layers and regions may be exaggerated for clarity.

When an element or layer is referred to as being "on" another element or layer, it may be directly on the other element or layer, or intervening elements or layers may be present. Meanwhile, when an element is referred to as being "directly on" another element, any intervening elements may not be present.

The spatially-relative terms such as "below", "beneath", "lower", "above", "upper", etc. may be used herein for ease of description to describe the relationship of one element or components with another element(s) or component(s) as illustrated in the drawings. It will be understood that the spatially relative terms are intended to encompass different orientations of the element in use or operation, in addition to the orientation depicted in the drawings. For example, if the element in the drawings is turned over, elements described as "below" or "beneath" other elements would then be oriented "above" the other elements. Thus, the exemplary term "below" can encompass both an orientation of above and below.

Further, in describing components of the present disclosure, terms such as first, second, A, B, (a), (b), etc. can be used. These terms are used only to differentiate the components from other components. Therefore, the nature, order, sequence, etc. of the corresponding components are not limited by these terms.

FIG. 1 is a system configuration view of a transparent display apparatus according to example embodiments. With reference to FIG. 1, the transparent display apparatus 1000 includes a transparent display panel 1100 in which a plurality of data lines DL to DLm and a plurality of gate lines GL1 to GLn are disposed and a plurality of sub-pixels is disposed, a data driver 1200 configured to drive the plurality of data lines DL to DLm, a gate driver 1300 configured to drive the plurality of gate lines GL1 to GLn, and a timing controller 1400 configured to control the data driver 1200 and the gate driver 1300.

The data driver 1200 drives the plurality of data lines by supplying a data voltage to the plurality of data lines. Further, the gate driver 1300 sequentially drives the plurality of gate lines by sequentially supplying a scan signal to the plurality of gate lines.

Furthermore, the timing controller 1400 controls the data driver 1200 and the gate driver 1300 by supplying a control signal to the data driver 1200 and the gate driver 1300. The timing controller 1400 starts a scan according to timing implemented in each frame, converts image data input from the outside to be suitable for a data signal form used by the data driver 1200, outputs the converted image data, and controls a driving of data at a proper time corresponding to the scan.

The gate driver 1300 sequentially drives the plurality of gate lines by sequentially supplying an ON voltage or OFF voltage scan signal to the plurality of gate lines according to the control of the timing controller 1400. Further, the gate driver 1300 may be located at only one side of the transparent display panel 1100 as illustrated in FIG. 1, or may be located at both sides thereof, if necessary, according to the driving method or the design of the transparent display panel.

Further, the gate driver 1300 may include one or more gate driver integrated circuits. Each of the gate driver integrated circuits may be connected to a bonding pad of the transparent display panel 1100 through a Tape Automated Bonding (TAB) method or a Chip On Glass (COG) method, or implemented in a Gate In Panel (GIP) type and directly disposed in the transparent display panel 1100, or may be integrated and disposed in the transparent display panel 1100.

Alternatively, each of the gate driver integrated circuits may be implemented in a Chip On Film (COF) type. In this case, a gate driving chip corresponding to each gate driver integrated circuit may be mounted on a flexible film, and one end of the flexible film may be bonded to the transparent display panel 1100.

If a specific gate line is opened, the data driver 1200 converts image data received from the timing controller 1400 into a data voltage of an analog form and supplies the data voltage to the plurality of data lines to drive the plurality of data lines. Further, the data driver 1200 may include at least one source driver integrated circuit to drive the plurality of data lines.

Each source driver integrated circuit may be connected to the bonding pad of the transparent display panel 1100 through a Tape Automated Bonding (TAB) method or a Chip On Glass (COG) method, or directly disposed in the transparent display panel 1100, or may be integrated and disposed in the transparent display panel 1100.

Alternatively, each gate driver integrated circuit may be implemented in a Chip On Film (COF) type. In this case, a source driving chip corresponding to each source driver integrated circuit may be mounted on a flexible film, and one end of the flexible film may be bonded to at least one source printed circuit board and the other end thereof may be bonded to the transparent display panel 1100.

The source printed circuit board may be connected to a control printed circuit board through a connector such as a flexible flat cable (FFC) or a flexible printed circuit (FPC). The timing controller 1400 is disposed in the control printed circuit board.

Further, a power controller configured to supply (or control) a voltage or current to the transparent display panel 1100, the data driver 1200, and the gate driver 1300 may be further disposed in the control printed circuit board. The above-described source printed circuit board and control printed circuit board may be formed as one printed circuit board.

Meanwhile, a pixel includes one or more sub-pixels. For example, in the present disclosure, one pixel may include two to four sub-pixels. Colors defined in the sub-pixels may selectively include red (R), green (G), blue (B), and white (W), but the present disclosure is not limited thereto.

Herein, an electrode connected to a thin film transistor for controlling emission of each sub-pixel in the display panel is referred to as a first electrode, and an electrode disposed on the entire surface of the display panel or disposed to include two or more pixels is referred to as a second electrode. If the first electrode is an anode electrode, the second electrode is a cathode electrode, and vice versa. In the following, the first electrode will be described as an anode electrode and the second electrode will be described as a cathode electrode in an exemplary embodiment, but the present disclosure is not limited thereto.

Further, an organic light emitting element includes the first electrode, an organic emission layer, and the second electrode. The organic emission layer may be disposed in each sub-pixel or may be disposed on the entire surface of a lower substrate.

Figure 2:
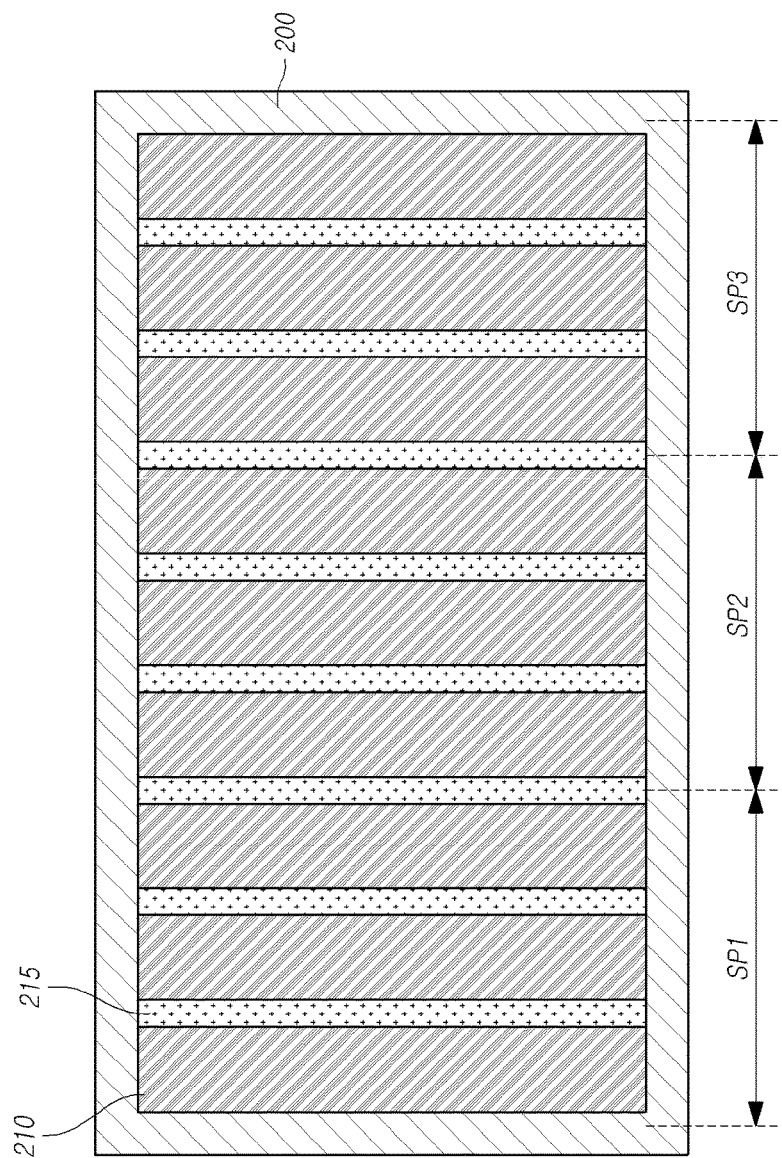
FIG. 2 is a plane view of an apparatus for use as both a mirror and a display in an OFF state according to a first example embodiment of the present disclosure.

Hereinafter, a plane view of an apparatus for use as both a mirror and a display in an OFF state according to a first example embodiment of the present disclosure will be explained with reference to FIG. 2. FIG. 2 is a plane view of the apparatus for use as both a mirror and a display in an OFF state according to the first example embodiment of the present disclosure.

With reference to FIG. 2, the apparatus for use as both a mirror and a display according to the first example embodiment of the present disclosure includes a separation layer 200, a thin film transistor array substrate (not illustrated) disposed under the separation layer 200, and an optical unit (i.e., the portion illustrated in FIG. 3 between the separation layer 200 and the second substrate 300) disposed on the separation layer 200. Herein, an optical unit includes reflective electrodes 210 disposed on the separation layer 200 and disposed in the form of stripes in a plane view. Further, a reflective electrode 210 may be disposed to be spaced away from another reflective electrode 210 adjacent thereto. That is, the reflective electrode 210 is not disposed on the entire surface of a display area, and, thus, the apparatus for both mirror and display can function as a mirror in an OFF state and can also display an image in an ON state.

In this case, the plurality of reflective electrodes 210 may be disposed in an area corresponding to at least one sub-pixel. For example, the plurality of reflective electrodes 210 may be disposed in a first sub-pixel SP1, a second sub-pixel SP2, and a third sub-pixel SP3, respectively. Herein, it is disclosed that one pixel in the display apparatus according to the first example embodiment of the present disclosure includes the first to third sub-pixels SP1, SP2, and SP3. However, the first example embodiment of the present disclosure is not limited thereto, and one pixel may include, for example, two or four sub-pixels.

Meanwhile, FIG. 2 illustrates a configuration in which the reflective electrodes 210 are disposed as stripes. However, the reflective electrodes 210 according to the first example embodiment of the present disclosure are not limited thereto. The reflective electrodes 210 may be disposed as a mesh on the separation layer 200. However, in the following, there will be described the configuration in which the reflective electrodes 210 disposed as stripes.

Further, the optical unit includes a barrier rib 215 disposed between the reflective electrodes. In this case, the barrier rib 215 may be formed of a transparent organic material or inorganic material. Further, an electrochromic layer 220 (illustrated in FIG. 3) and an electrode layer 230 (illustrated in FIG. 3) are disposed on the reflective electrodes 210 and the barrier rib 215.

Meanwhile, FIG. 2 illustrates a state in which an electric field is not applied to the thin film transistor array substrate (not illustrated) and the optical unit. If an electric field is not applied to the thin film transistor array substrate (not illustrated) and the optical unit, the optical unit is transparent and a front surface of the display apparatus may be in a mirror mode.

Specifically, because an external light incident into an upper substrate 230 (illustrated in FIG. 3) is reflected by the plurality of reflective electrodes 210, a reflective brightness is increased. Thus, the display apparatus can function as a mirror. In this case, the sum of the sizes of the plurality of reflective electrodes 210 may account for 70% to 95% of the size of the display area. If the sum of the sizes of the plurality of reflective electrodes 210 accounts for less than 70%, it is difficult to realize a clear mirror. If the sum of the sizes of the plurality of reflective electrodes 210 accounts for more than 95%, it may be difficult to display an image when the display apparatus is driven.

Figure 3:
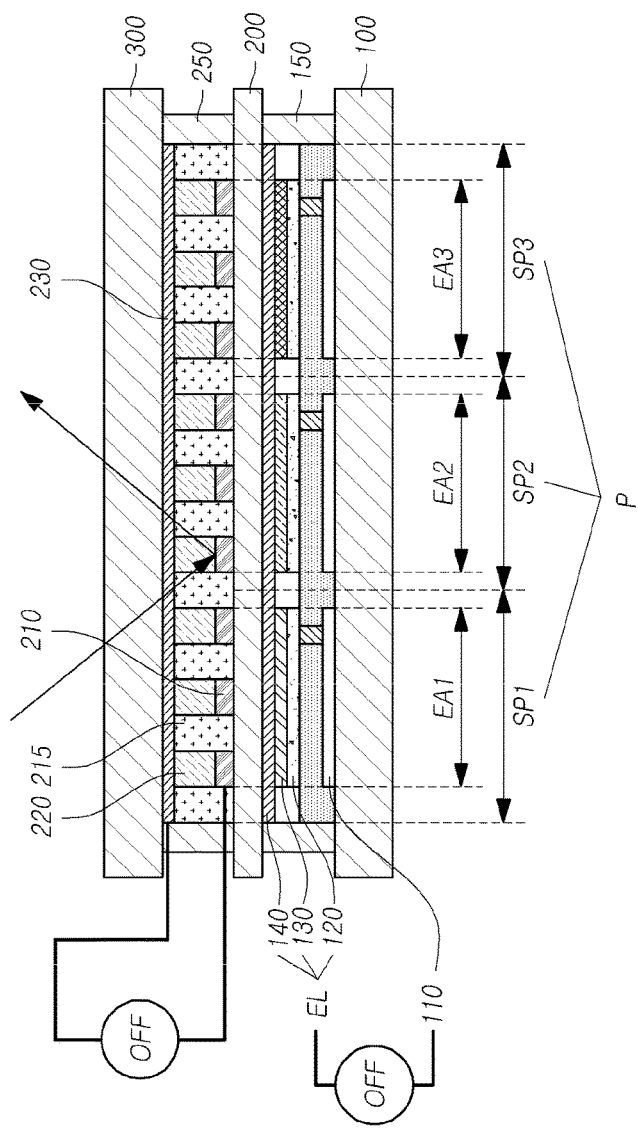
FIG. 3 is a cross-sectional view of the apparatus for use as both a mirror and a display in an OFF state according to the first example embodiment of the present disclosure.

The above-described configuration will be described in detail with reference to FIG. 3. FIG. 3 is a cross-sectional view of the apparatus for use as both a mirror and a display in an OFF state according to the first example embodiment of the present disclosure.

With reference to FIG. 3, in the apparatus for use as both a mirror and a display according to the first example embodiment of the present disclosure, a thin film transistor array substrate is disposed under the separation layer 200 and an optical unit is disposed on the separation layer 200. The thin film transistor array substrate includes a plurality of pixels P. One pixel P may include a first sub-pixel SP1, a second sub-pixel SP2, and a third sub-pixel SP3. Further, thin film transistors 110 are disposed on a first substrate 100 to correspond to the sub-pixels SP1, SP2, and SP3, respectively.

An insulation layer 115 is disposed on the thin film transistor 110. The insulation layer 115 may be an inorganic insulation layer or an organic insulation layer, and may be formed into a multilayer. An organic light emitting element EL is disposed on the insulation layer 115. In this case, the thin film transistor 110 and the organic light emitting element EL may be electrically connected to each other through a contact hole 111 formed in the insulation layer 115.

The organic light emitting element EL includes a first electrode 120, an organic emission layer 130, and a second electrode 140. Herein, the organic light emitting elements EL disposed in the first sub-pixel SP1, the second sub-pixel SP2, and the third sub-pixel SP3 may emit light of different colors, respectively. In other embodiment, the organic light emitting elements EL may be disposed in the entire sub-pixels.

Meanwhile, the first electrode 120 in the organic light emitting element EL may be a reflective layer. Although the first electrode 120 is illustrated as a single layer in the drawing, the first example embodiment of the present disclosure is not limited thereto. The first electrode 120 may be formed with a multilayer structure. The first electrode 120 formed with a multilayer structure may include a reflective layer. Although the present disclosure discloses a configuration in which the first electrode 120 includes a reflective layer, the first example embodiment of the present disclosure is not limited thereto. The first electrode 120 may not include a reflective layer. In this case, the optical unit may be disposed on a back surface of the first substrate 100.

The separation layer 200 is disposed on the organic light emitting element EL. Herein, the separation layer 200 may be formed of the same material as the first substrate 100 or the second substrate 200. For example, the separation layer 200 may be formed of glass or transparent plastic. Since the separation layer 200 is formed of the same material as the first substrate 100 or the second substrate 200, the separation layer 200 can easily transmit a light emitted from the organic light emitting element EL and thus can output the light to the outside of the display apparatus.

A first seal line 150 may be disposed between the first substrate 100 and the separation layer 200. The first seal line 150 may be disposed at an outer periphery as a non-display area of the first substrate 100. Further, the first seal line 150 has an effect of suppressing degradation of an organic light emitting diode caused by permeation of moisture.

Meanwhile, the optical unit including the reflective electrode 215, the electrochromic layer 220, and the electrode layer 230 is disposed on the separation layer. Specifically, a plurality of reflective electrodes 210 is disposed on the separation layer 200. Herein, the plurality of reflective electrodes 210 may be disposed in areas corresponding to the respective sub-pixels SP1, SP2, and SP3.

Specifically, the plurality of reflective electrodes 210 may be disposed corresponding to a first emission area EA1 in the first sub-pixel SP1, a second emission area EA2 in the second sub-pixel SP2, and a third emission area EA3 in the third sub-pixel SP3, respectively. Thus, due to the plurality of reflective electrodes 210, color mixing between sub-pixels that emit lights of different colors can be suppressed.

Further, the plurality of reflective electrodes 210 may be disposed to be spaced away from each other within the respective sub-pixels SP1, SP2, and SP3 in a cross-sectional view. In this case, the barrier rib 215 may be disposed between a reflective electrode 210 and another reflective electrode 210 adjacent thereto. Herein, the barrier rib 215 can suppress color mixing between sub-pixels that emit lights of different colors.

Further, the barrier rib 215 may be formed of a transparent organic material or a transparent inorganic material. Thus, when the organic light emitting element EL is driven to emit light, the light emitted from the organic light emitting element EL can penetrate the barrier rib 215 and then can be output to the outside.

Furthermore, the electrochromic layer 220 may be disposed on the reflective electrode 210 and the separation layer 200. Herein, the electrochromic layer 220 may include an electrochromic material, an electrolyte, and a counter electrode material, and the electrochromic material may further include a solvent.

Herein, the electrochromic material refers to a material of which a color and transmittance are changed by reduction or oxidation of ions upon application of an electric field. For example, the electrochromic material may be any one of viologen-based electrochromic, 1,1'-dibenzyl-4,4'-bipyridinium dibromide, 1,1'-dibenzyl-4,4'-bipyridinium dichloride, 1,1'-bis(4-(chloromethyl)benzyl)-4,4'-bipyridinium dichloride, and 1,1'-dibenzyl-4,4'-bipyridinium bistetrafluorborate, or mixtures thereof, but may not be limited thereto.

The electrolyte may be t-butylammoinum perchlorate, t-butylammoinum-t-fluoroborate, lithium perchlorate, etc., but may not be limited thereto. Further, the counter electrode material may include TMPD (N,N,N',N'-tetramethyl-1,4-phenylenediamine) and the solvent may include PC (propylene carbonate), but may not be limited thereto.

The electrode layer 230 is disposed on the separation layer 200 including the electrochromic layer 220. Herein, the electrode layer 230 may be formed of a transparent conductive material. Thus, when the organic light emitting element EL is driven to emit light, the light emitted from the organic light emitting element EL can penetrate the electrode layer 230 and then can be output to the outside.

A second substrate 300 is disposed on the electrode layer 230. The second substrate 300 is formed of glass or transparent plastic. Thus, light emitted from the organic light emitting element EL can penetrate the second substrate 300 without being absorbed to the second substrate 300.

Further, a second seal line 250 is disposed between the separation layer 200 and the second substrate 300. The second seal line 250 may be disposed at an outer periphery as a non-display area between the second substrate 300 and the separation layer 200. In this case, the second seal line 250 can suppress a leakage of the materials of the electrochromic layer 220 to the outside.

Meanwhile, FIG. 3 illustrates that the apparatus for use as both a mirror and a display according to the first example embodiment of the present disclosure is in an OFF state. In this case, the thin film transistor 110 and the optical unit may be in an OFF state. That is, the thin film transistor 110 configured to drive the organic light emitting element EL is in an OFF state, and, thus, the organic light emitting element EL does not emit a light. Further, the optical unit is also in an OFF state, and thus, an electric field is not applied between the reflective electrode 210 and the electrode layer 230. Therefore, the electrochromic layer 220 is not discolored, but remains transparent.

Accordingly, light incident from the outside of the second substrate 300 penetrates the second substrate 300, the electrode layer 230, the barrier rib 215, and the electrochromic layer 220 and then reaches the reflective electrode 210. The light reaching the reflective electrode 210 is reflected by the reflective electrode 210 and then penetrates the electrochromic layer 220, the barrier rib 215, the electrode layer 230, and the second substrate 300. Then, the light is output to the outside. That is, when the apparatus for use as both a mirror and a display is in an OFF state, the apparatus can function as a mirror having a high reflective brightness by increasing the reflectivity of an external light through the reflective electrode 210.

Figure 4:
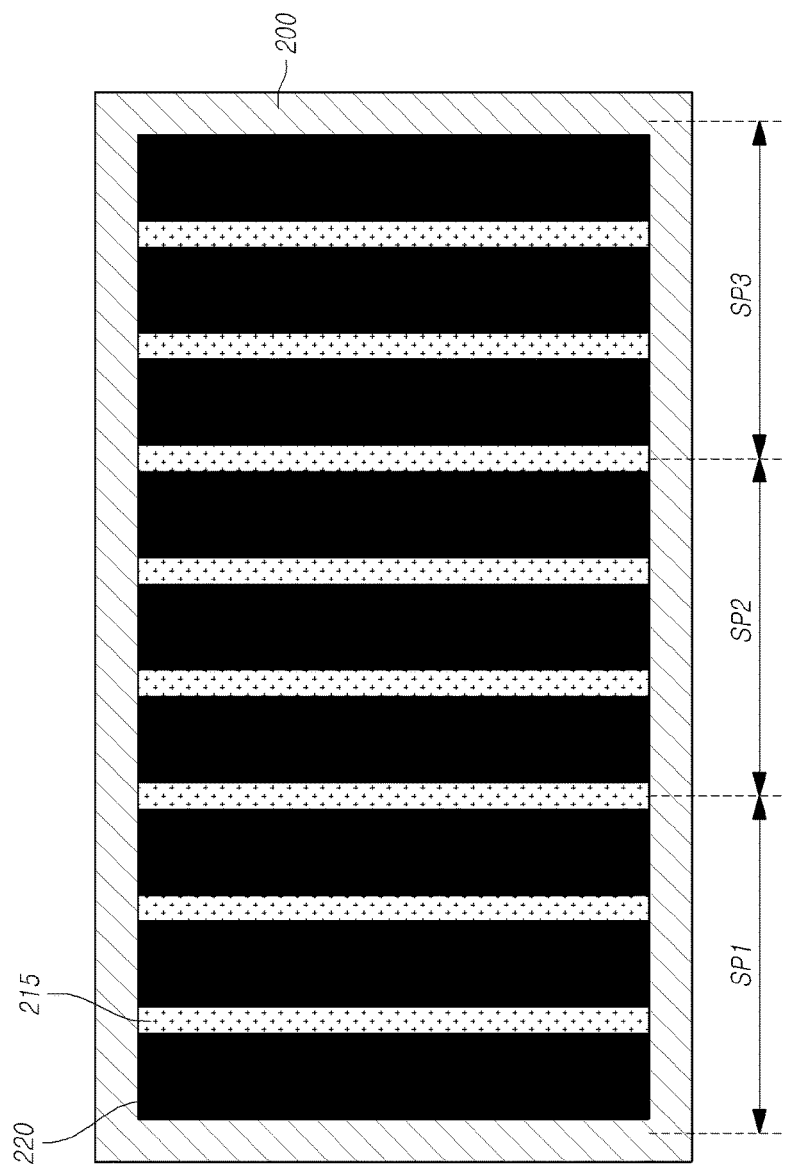
FIG. 4 is a plane view of the apparatus for use as both a mirror and a display in an ON state according to the first example embodiment of the present disclosure.

Hereinafter, the apparatus for use as both a mirror and a display in an ON state according to the first example embodiment of the present disclosure will be described with reference to FIG. 4 and FIG. 5. FIG. 4 is a plane view of the apparatus for use as both a mirror and a display in an ON state according to the first example embodiment of the present disclosure.

With reference to FIG. 4, when the apparatus for use as both a mirror and a display according to the first example embodiment of the present disclosure is in an ON state, a partial area of the optical unit may be discolored. Specifically, the electrochromic layer 220 disposed in an area corresponding to the reflective electrode disposed on the separation layer 200 may be discolored. For example, the electrochromic layer 220 may be discolored into a deep blue or black.

Therefore, light incident from the outside of the display apparatus is absorbed by the electrochromic layer 220. Thus, when the apparatus for both mirror and display is in an ON state, the reflectivity of an external light can be reduced.

The above-described configuration will be described in detail with reference to FIG. 5. FIG. 5 is a cross-sectional view of the apparatus for use as both a mirror and a display in an ON state according to the first example embodiment of the present disclosure. The apparatus for both mirror and display illustrated in FIG. 5 may include the same components as those of the above-described example embodiment.

The redundant description thereof may be omitted herein. Further, like components are assigned like reference numerals.

Figure 5:
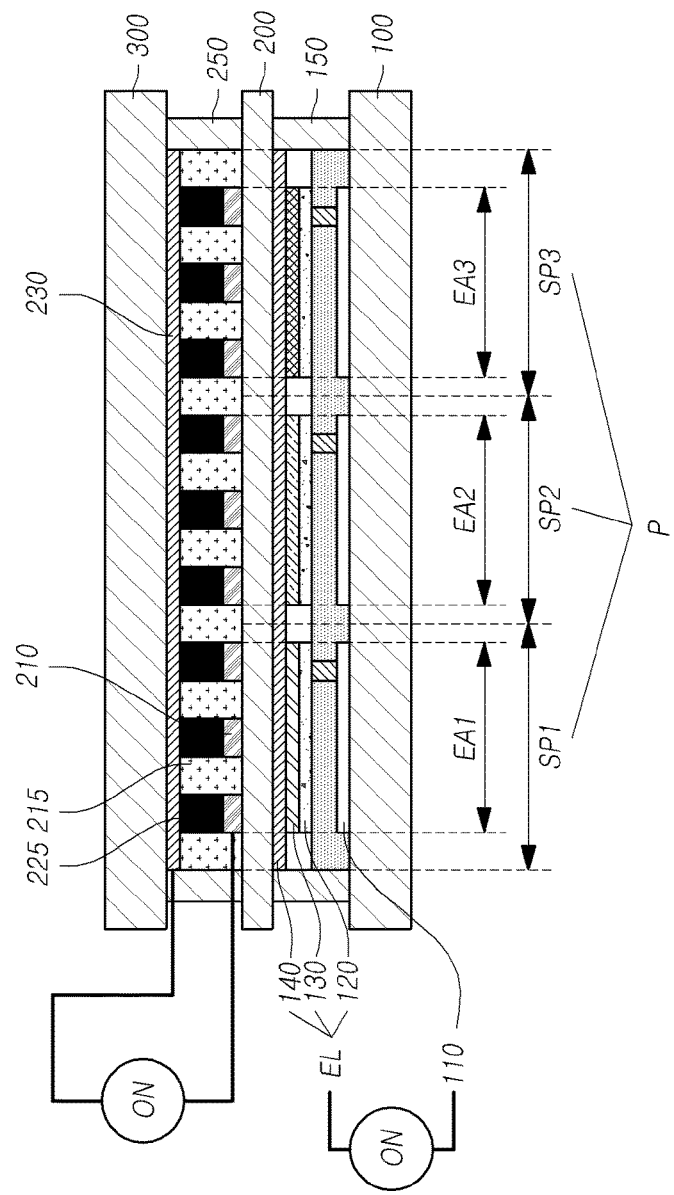
FIG. 5 is a cross-sectional view of the apparatus for use as both a mirror and a display in an ON state according to the first example embodiment of the present disclosure.

With reference to FIG. 5, when the apparatus for use as both a mirror and a display according to the first example embodiment of the present disclosure is in an ON state, the thin film transistor 110 and the optical unit may be in an ON state. That is, the thin film transistor 110 configured to drive the organic light emitting element EL is in an ON state, and thus, the organic light emitting element EL disposed in each of the sub-pixels SP1, SP2, and SP3 may emit light toward the second electrode 140. Further, the light emitted from the organic light emitting element EL may be output to the outside through the separation layer 200, the barrier rib 215, the electrode layer 230, and the second substrate 300.

Figure 6:
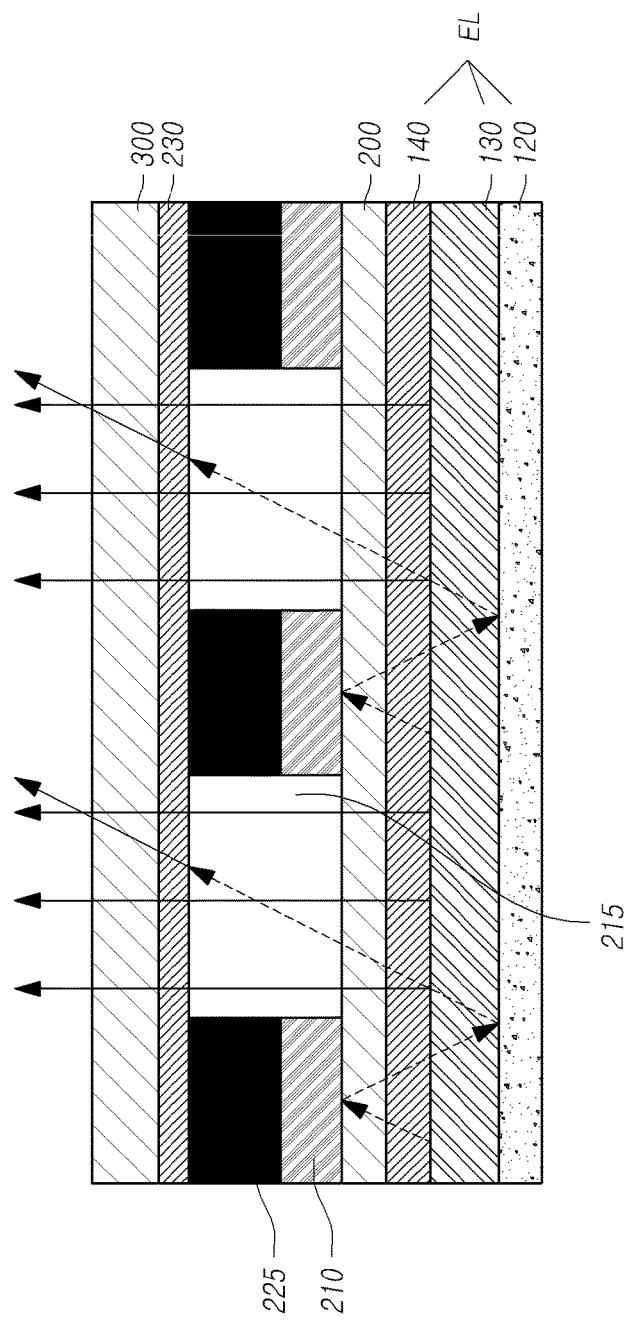
FIG. 6 is a diagram illustrating a light path of emitted light from an organic light emitting element within the apparatus for use as both a mirror and a display according to the first example embodiment of the present disclosure.
Figure 7:
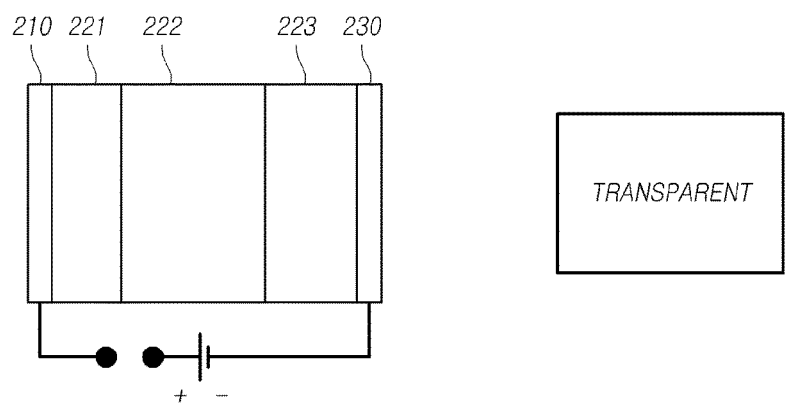
FIG. 7 through FIG. 10 are diagrams illustrating a principle of discoloring an electrochromic layer when an electric field is applied according to the present disclosure.
Figure 8:
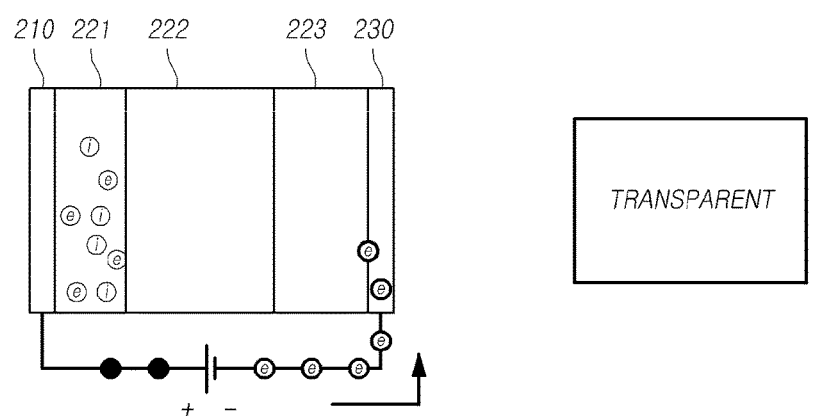
Figure 9:
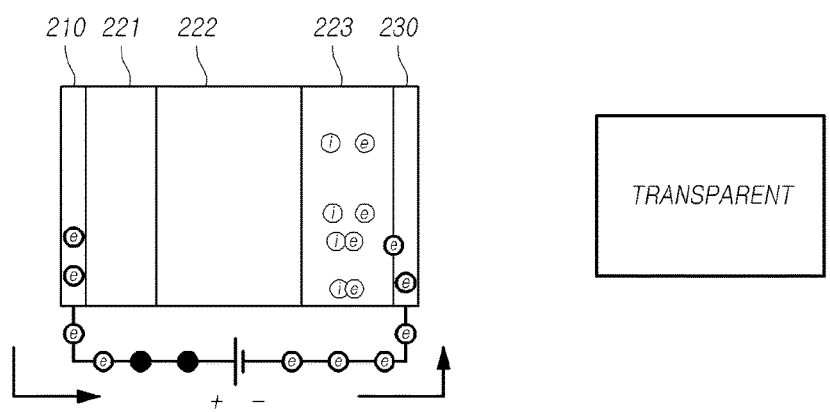
Figure 10:
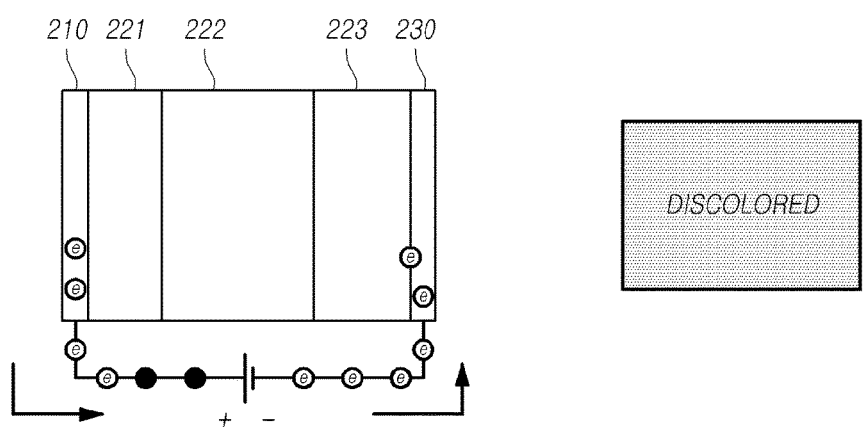

Hereinafter, a light path emitted light from the organic light emitting element EL within the apparatus will be described in detail with reference to FIG. 6. FIG. 6 is a diagram illustrating a light path of emitted light from an organic light emitting element within the apparatus according to the first example embodiment of the present disclosure.

With reference to FIG. 6, a portion of the light emitted from the organic emission layer 130 of the organic light emitting element EL propagates toward the second electrode 140. Further, another portion of the light emitted from the organic emission layer 130 propagates toward the first electrode 120. In this case, since the first electrode 120 includes a reflective layer, the light is reflected by the first electrode 120 and a light path is changed toward the second electrode 140. That is, the light emitted from the organic emission layer 130 propagates toward the second electrode 140.

The light propagating toward the second electrode 140 penetrates the separation layer 200. A part of the light penetrating the separation layer 200 penetrates the barrier rib 215, the electrode layer 230, and the second substrate 300 in sequence and then is output to the outside of the display apparatus. Herein, the second electrode 140, the separation layer 200, the barrier rib 215, the electrode layer 230, and the second substrate 300 are formed of transparent materials. Thus, the light emitted from the organic emission layer 130 may be hardly absorbed by the second electrode 140, the separation layer 200, the barrier rib 215, the electrode layer 230, and the second substrate 300, but may penetrate through them to be output to the outside of the display apparatus.

Further, a portion of the light penetrating the separation layer 200 may reach the reflective electrode 210. The light having a changed light path is reflected by the reflective electrode 210 and a pathway of the light is changed toward the first electrode 120 of the organic light emitting element EL. The light of which the pathway has been changed is reflected again by the reflective layer of the first electrode 120 and then penetrates the organic emission layer 130, the second electrode 140, the separation layer 200, the barrier rib 214, the electrode layer 230, and the second substrate 300. Then, the light is output to the outside. Herein, the light reaching the reflective electrode 210 may be reflected at least one time by the first electrode 120 and its light path can be changed.

That is, in the apparatus according to the first example embodiment of the present disclosure, the reflective electrodes 210 are disposed in the areas corresponding to the emission areas of the respective sub-pixels. However, light emitted from the organic light emitting element EL can be output to the outside of the display apparatus without a loss of the light.

Meanwhile, when the apparatus according to the first example embodiment of the present disclosure is in an ON state as illustrated in FIG. 5, i.e., when the apparatus for both mirror and display displays an image, the optical unit is in an ON state in which an electrochromic layer 225 disposed between the reflective electrode 210 and the electrode layer 230 is discolored. For example, the electrochromic layer 225 may be discolored into deep blue or black.

A principle of discoloring the electrochromic layer 225 will be described with reference to FIG. 7 through FIG. 10. FIG. 7 through FIG. 10 are diagrams illustrating a principle of discoloring an electrochromic layer when an electric field is applied according to the present disclosure.

With reference to FIG. 7 through FIG. 10, the optical unit according to the first example embodiment of the present disclosure includes the reflective electrode 210, the electrochromic layer 220, and the electrode layer 230. Herein, the electrochromic layer 220 may include a counter electrode layer 221, an electrolyte layer 222, and an electrochromic material layer 223.

When the optical unit is in an OFF state, it may be transparent. That is, when the optical unit is in an OFF state, the electrochromic layer 220 is not discolored, but remains transparent.

When the optical unit is in an ON state, the electrochromic layer 220 is discolored to be opaque. Specifically, if an electric field is applied to each of the reflective electrode 210 and the electrode layer 230 of the optical unit, ions and electrons are generated from the counter electrode layer 221 of the electrochromic layer 220.

The electrons generated from the counter electrode layer 221 move to the electrochromic material layer 223 through the reflective electrode 210 and the electrode layer 230. The ions generated from the counter electrode layer 221 move to the electrochromic material layer 223 through the electrolyte layer 222. Meanwhile, the electrolyte may include hydrogen ions or lithium ions to readily move the electrons generated from the counter electrode layer 221 to the electrochromic material layer 223.

The electrons generated from the counter electrode layer 221 and the ions included in the electrolyte layer 222 are combined in the electrochromic material layer 223. Thus, an energy band gap of the electrochromic material layer 223 is changed. That is, a change in energy band gap of the electrochromic material layer 223 causes a change in wavelength of a light to be absorbed by the electrochromic material layer 223.

Specifically, when the electrochromic material layer 223 absorbs light having a long wavelength, the electrochromic material layer 223 transmits light having a short wavelength. Therefore, the electrochromic layer 220 transmits deep blue or black, and, thus, the electrochromic layer 220 may be discolored into blue or black.

In other words, if an electric field is applied to the reflective electrode 210 and the electrode layer 230, the counter electrode layer 221 is oxidized and the electrochromic material layer 223 is reduced. Accordingly, the electrochromic layer 220 may be discolored to be opaque. Further, if the electric field applied to the reflective electrode 210 and the electrode layer 230 is cut off, the electrochromic layer 220 is reversibly turned transparent.

That is, when the apparatus for use as both a mirror and a display displays an image, the electrochromic layer 220 disposed on the reflective electrode 210 is discolored to be opaque. Thus, external light incident into the second substrate 300 can be suppressed from being reflected by the reflective electrode 210 and then output to the outside of the second substrate 300.

Further, the barrier rib 215 is disposed between the reflective electrode 210 and another reflective electrode 210 adjacent thereto as illustrated in FIG. 5. Thus, a sufficient area can be secured for light emitted from the organic light emitting element EL to penetrate the separation layer 200, the barrier rib 215, the electrode layer 230, and the second substrate 300 to be output to the outside.

Specifically, because the barrier rib 215 is disposed between the reflective electrode 210 and another reflective electrode 210 adjacent thereto, a light path of light emitted from the organic light emitting element EL is discolored by the electrochromic layer 225. Thus, absorption of the light emitted from the organic light emitting element EL can be suppressed.

Figure 11:
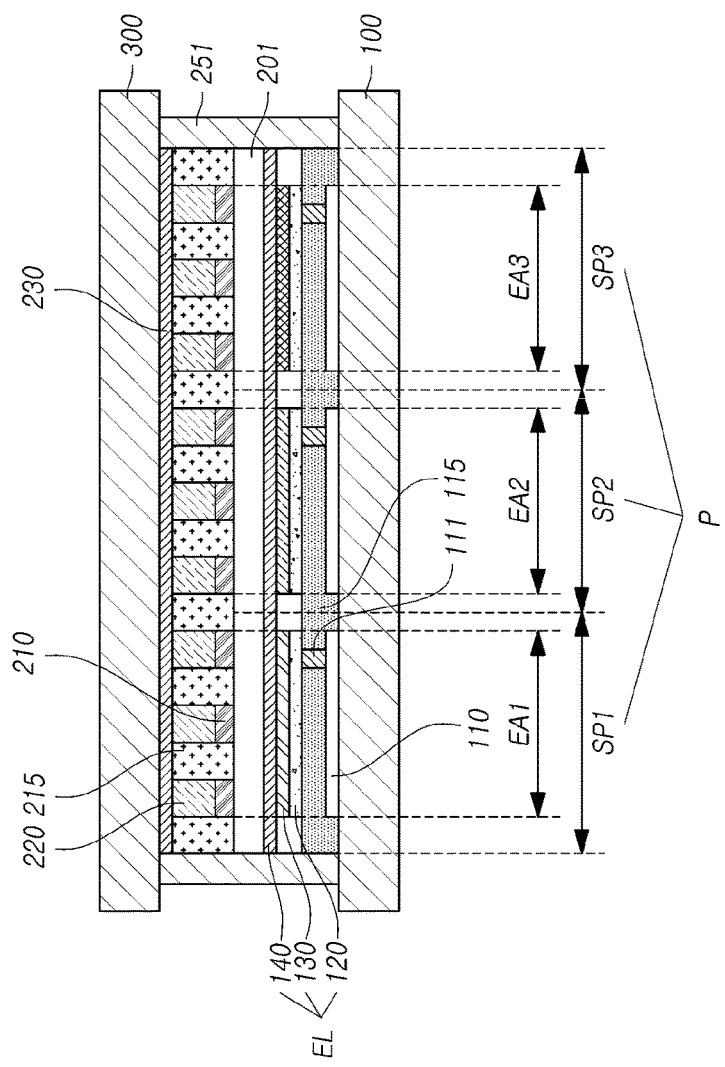
FIG. 11 is a cross-sectional view of an apparatus for use as both a mirror and a display according to a second example embodiment of the present disclosure.

Hereinafter, an apparatus for use as both a mirror and a display according to a second example embodiment of the present disclosure will be described with reference to FIG. 11. FIG. 11 is a cross-sectional view of the apparatus according to the second example embodiment of the present disclosure.

The apparatus according to the second example embodiment may include the same components as those of the above-described example embodiment. The redundant description thereof may be omitted herein. Further, like components are assigned like reference numerals.

With reference to FIG. 11, the apparatus according to the second example embodiment of the present disclosure includes a separation layer 201 serving as an encapsulation layer for protecting the organic light emitting element EL unlike the apparatus according to the first example embodiment illustrated in FIG. 3 in which the separation layer 200 is formed of glass or transparent plastic. Herein, the separation layer 201 can suppress permeation of moisture and oxygen into the organic light emitting element EL.

In this case, the separation layer 201 may be formed as a thin film. Thus, a lightweight, thin apparatus can be realized for uses both a mirror and a display.

FIG. 11 illustrates the separation layer 201 formed as a single layer. However, the apparatus according to the second example embodiment of the present disclosure is not limited thereto, and may include a configuration in which multilayered thin films are overlapped. In this case, the separation layer 201 may have a configuration in which an organic layer and an inorganic layer are alternately disposed.

FIG. 3 illustrates that the first seal line 150 is disposed between the first substrate 100 and the separation layer 200 and that the second seal line 250 is disposed between the separation layer 200 and the second substrate 300. However, FIG. 11 illustrates that only a third seal line 251 is disposed between the first substrate 100 and the second substrate 300 because the separation layer 201 is configured as an encapsulation layer.

That is, in the apparatus according to the second example embodiment of the present disclosure, only the third seal line 251 is disposed between the first substrate 100 and the second substrate 300 so that a display apparatus including the organic light emitting element EL and a mirror apparatus including the optical unit are manufactured as one body. Thus, a lightweight thin apparatus can be realized for use as both a mirror and a display.

Figure 12:
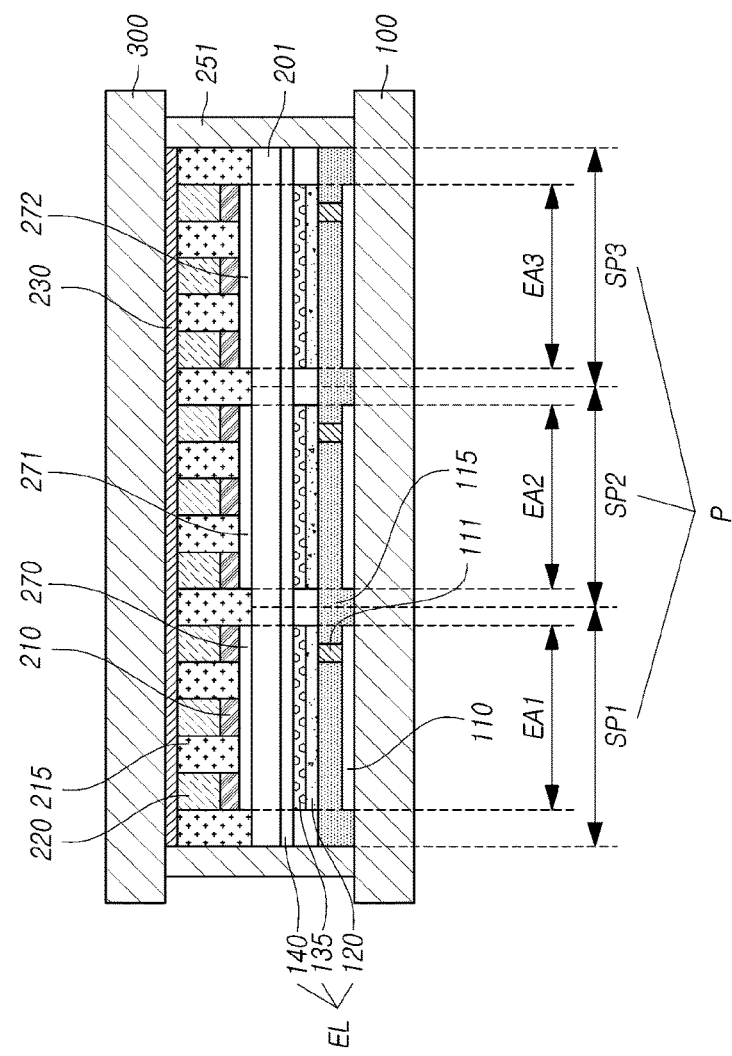
FIG. 12 is a cross-sectional view of an apparatus for use as both a mirror and a display according to a third example embodiment of the present disclosure.

Hereinafter, an apparatus for use as both a mirror and a display according to a third example embodiment of the present disclosure will be described with reference to FIG. 12. FIG. 12 is a cross-sectional view of the apparatus for use as both a mirror and a display according to the third example embodiment of the present disclosure.

The apparatus according to the third example embodiment may include the same components as those of the above-described example embodiments. The redundant description thereof may be omitted herein. Further, like components are assigned like reference numerals.

With reference to FIG. 12, in the apparatus according to the third example embodiment of the present disclosure, organic emission layers 135 disposed in the respective sub-pixels SP1, SP2, and SP3 may emit light of the same color. For example, the organic emission layer 135 may be configured to emit white light.

FIG. 12 illustrates that the organic emission layer 135 of the present disclosure is disposed only on the first electrode 120 of the organic light emitting element EL in each of the sub-pixels SP1, SP2, and SP3. However, the third example embodiment of the present disclosure is not limited thereto. The organic emission layer 135 may also be disposed on a bank pattern (not illustrated) disposed to be overlapped with a portion of an upper surface of the first electrode 120.

Further, color filter layers 270, 271, and 272 may be disposed on the separation layer 201 in areas corresponding to the emission areas EA1, EA2, and EA3 of the sub-pixels SP1, SP2, and SP3, respectively. Herein, the color filter layers 270, 271, and 272 may respectively transmit light having different wavelength ranges.

For example, the color filter layer 270 disposed in an area corresponding to the first emission area EA1 may be configured to transmit only red light, the color filter layer 271 disposed in an area corresponding to the second emission area EA2 may be configured to transmit only green light, and the color filter layer 272 disposed in an area corresponding to the third emission area EA3 may be configured to transmit only blue light.

Meanwhile, if the apparatus according to the third example embodiment of the present disclosure is in an ON state, because the color filter layer 270 configured to transmit only red light is disposed in the first emission area EA1, only light having a wavelength corresponding to red light in light emitted from the organic light emitting element EL may penetrate the color filter layer 270 to be output to the outside of the second substrate 300.

Further, because the color filter layer 271 configured to transmit only green light is disposed in the second emission area EA2, only light having a wavelength corresponding to green light in light emitted from the organic light emitting element EL may penetrate the color filter layer 271 to be output to the outside of the second substrate 300.

Furthermore, because the color filter layer 272 configured to transmit only blue light is disposed in the third emission area EA3, only light having a wavelength corresponding to the blue light in light emitted from the organic light emitting element EL may penetrate the color filter layer 272 to be output to the outside of the second substrate 300.

In this case, the color filter layers 270, 271, and 272 are disposed in the areas corresponding to the first to third emission areas EA1, EA2, and EA3, respectively, and thus, light incident from the second substrate 300 can be absorbed effectively by the color filter layers 270, 271, and 272. Therefore, a polarizing plate for reducing light reflection by external light may be omitted. Although the organic emission layer 135 of the apparatus for use as both a mirror and a display according to the third example embodiment of the present disclosure is illustrated as an organic emission layer configured to emit a white light, the apparatus according to the third example embodiment of the present disclosure is not limited thereto. The organic emission layers applied to the first and second example embodiments may be applied to the third example embodiment. In this case, the color filter layers 270, 271, and 272 may improve the color purity of light emitted from the respective emission areas EA1, EA2, and EA3.

Figure 13:
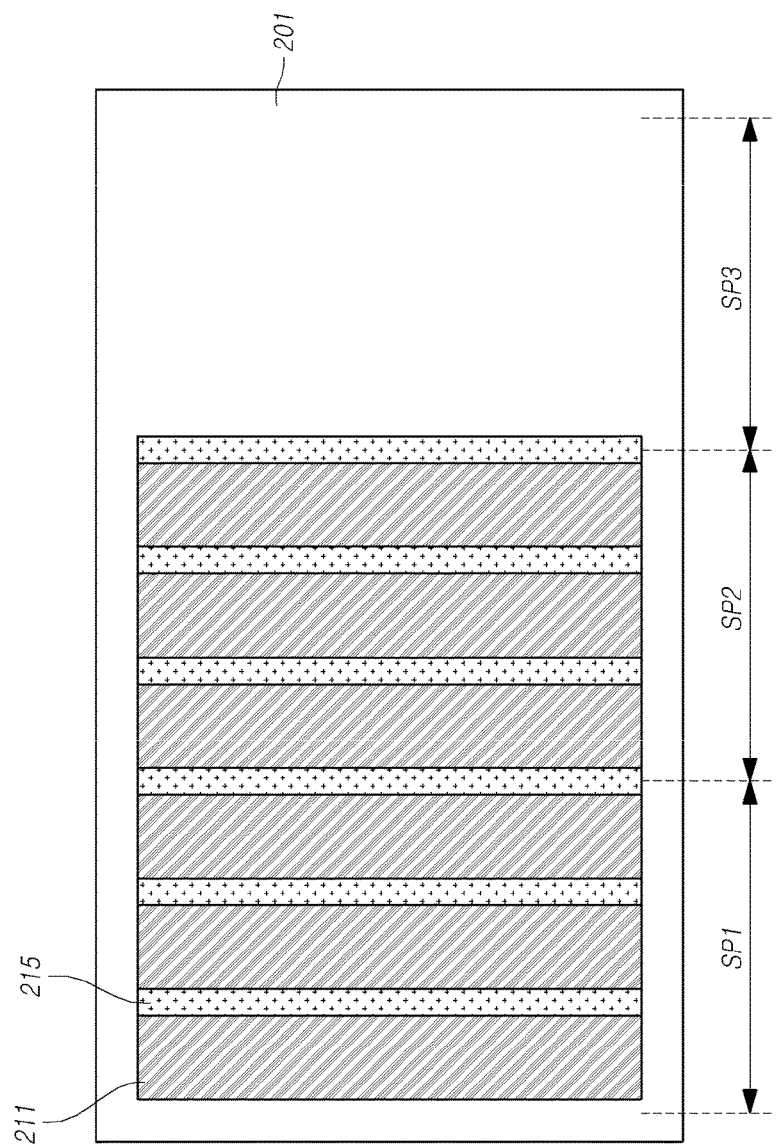
FIG. 13 is a plane view of an apparatus for use as both mirror and a display in an OFF state according to a fourth example embodiment of the present disclosure.
Figure 14:
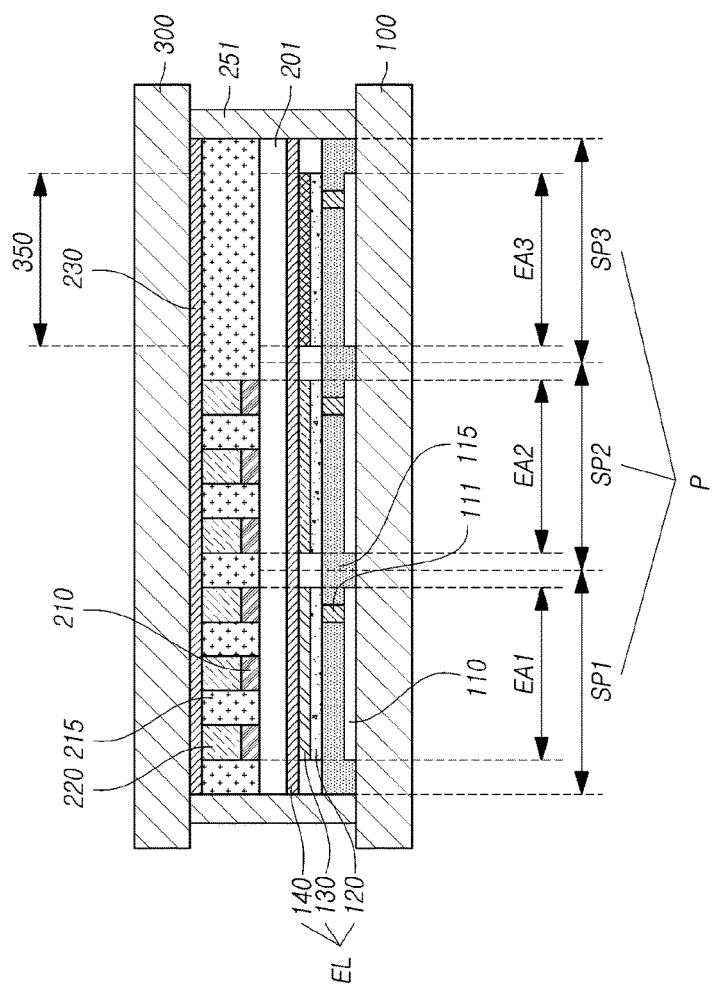
FIG. 14 is a cross-sectional view of the apparatus for use as both a mirror and a display in an OFF state according to the fourth example embodiment of the present disclosure.

Hereinafter, an apparatus for use as both a mirror and a display according to a fourth example embodiment of the present disclosure will be described with reference to FIG. 13 and FIG. 14. FIG. 13 is a plane view of the apparatus in an OFF state according to the fourth example embodiment of the present disclosure. FIG. 14 is a cross-sectional view of the apparatus in an OFF state according to the fourth example embodiment of the present disclosure.

The apparatus according to the fourth example embodiment may include the same components as those of the above-described example embodiments. The redundant description thereof may be omitted herein. Further, like components are assigned like reference numerals.

With reference to FIG. 13 and FIG. 14, in the apparatus according to the fourth example embodiment of the present disclosure, reflective electrodes 211 may be disposed to correspond to at least one sub-pixel area of the sub-pixels SP1, SP2, and SP3. For example, the reflective electrodes 211 may be disposed in areas corresponding to the first sub-pixel SP1 and the second sub-pixel SP2. Specifically, the reflective electrodes 211 may be disposed in an area corresponding to the first emission area EA1 of the first sub-pixel SP1 and an area corresponding to the second emission area EA2 of the second sub-pixel SP2.

Further, the apparatus may include a reflective electrode non-disposition area 350 in at least one sub-pixel. For example, the reflective electrode non-disposition area 350 may correspond to the third emission area EA3 of the third sub-pixel SP3. That is, since the reflective electrode 211 is not disposed in the third emission area EA3, the third emission area EA3 can remain transparent even when the optical unit is in an ON state. Therefore, when the apparatus is in an ON state, light emitted from the organic light emitting element EL can be output from the entire area of the third emission area EA3 to the outside of the second substrate 300.

Further, since the reflective electrode 211 is not disposed in the third emission area EA3, when the apparatus is in an OFF state, it does not function as a mirror due to a low reflectivity of an external light. That is, external light incident into the reflective electrode 211 disposed on the separation layer 201 is reflected in the first emission area EA1 and the second emission area EA2 and then output to the outside of the display apparatus. Thus, the first sub-pixel SP1 and the second sub-pixel SP2 can function as a mirror but the third sub-pixel SP3 cannot function as a mirror.

Therefore, in the apparatus for use as both a mirror and a display according to the fourth example embodiment, an area to function as a mirror can be selectively changed and a size of a mirror area can be regulated.

As described above, in an apparatus for use as both a mirror and a display according to the example embodiments of the present disclosure, a thin film transistor array substrate is disposed under a separation layer and an optical unit is disposed on the separation layer. Thus, the apparatus can function as a mirror having a high reflectivity in an OFF state and also as a display with high image quality in an ON state.

Further, in the apparatus for use as both a mirror and a display according to the example embodiments of the present disclosure, a Dual Brightness Enhanced Film (DBEF) is not necessary to realize a mirror mode and the optical unit is disposed on the separation layer. Thus, an apparatus for use as both a mirror and a display can be provided with reduced unit cost and no distortion of a mirror image.

It will be apparent to those skilled in the art that various modifications and variations can be made in the apparatus for use as both a mirror and a display of the present invention without departing from the spirit or scope of the invention. Thus, it is intended that the present invention cover the modifications and variations of this invention provided they come within the scope of the appended claims and their equivalents.

What is claimed is:

1. An apparatus for use as both a mirror and a display, comprising:
a first substrate;
a plurality of sub-pixels on the first substrate;
an organic light emitting element on the first substrate;
a separation layer on the organic light emitting element;
an optical unit on the separation layer, the optical unit including a plurality of reflective electrodes in an area corresponding to at least one sub-pixel, an electrochromic layer on the reflective electrodes, and an electrode layer disposed on the electrochromic layer; and
a second substrate on the optical unit,
wherein, if an electric field is applied to the organic light emitting element and the optical unit, the apparatus operates in a display mode, and
wherein, if an electric field is not applied to the organic light emitting element and the optical unit, the apparatus operates in a mirror mode.

2. The apparatus according to claim 1, wherein the optical unit includes a barrier rib disposed between the reflective electrodes.

3. The apparatus according to claim 2, wherein the barrier rib includes a transparent organic material or inorganic material.

4. The apparatus according to claim 1, wherein the separation layer includes any one of an encapsulation material and a same material of the first substrate or the second substrate.

5. The apparatus according to claim 1, wherein the reflective electrodes are disposed in the form of stripes or a mesh.

6. The apparatus according to claim 1, wherein the reflective electrodes are disposed in areas corresponding to emission areas of the respective sub-pixels.

7. The apparatus according to claim 6, wherein multiple ones of the plurality of reflective electrodes are disposed in each of the emission areas of the respective subpixels and are spaced away from each other in each of the emission areas.

8. The apparatus according to claim 1, wherein the electrode layer includes a transparent conductive material.

9. The apparatus according to claim 1, further comprising a color filter layer disposed in at least one sub-pixel of the plurality of sub-pixels and disposed between the separation layer and the reflective electrodes of the at least one sub-pixel.

10. The apparatus according to claim 1, further comprising a reflective electrode non-disposition area in at least one sub-pixel of the plurality of sub-pixels.

11. The apparatus according to claim 1, wherein the organic light emitting element includes a first electrode, an organic emission layer disposed on the first electrode, and a second electrode disposed on the organic emission layer, and wherein the first electrode includes a reflective layer.

12. The apparatus according to claim 1, wherein the organic light emitting element is disposed in each of a plurality of sub-pixels or the organic light emitting element is disposed in the entire sub-pixels.

13. An apparatus for use as both a mirror and a display, comprising:
a first substrate;
a plurality of sub-pixels on the first substrate;
an organic light emitting element on the first substrate;
a separation layer on the organic light emitting element;
a plurality of reflective electrodes on the separation layer and disposed in an area corresponding to at least one sub-pixel;
an electrochromic layer disposed on the reflective electrodes;
an electrode layer disposed on the electrochromic layer; and
a second substrate disposed on the electrode layer.

14. The apparatus according to claim 13, further comprising a barrier rib between the reflective electrodes.

15. The apparatus according to claim 14, wherein the barrier rib includes a transparent organic material or inorganic material.

16. The apparatus according to claim 13, wherein the separation layer includes any one of an encapsulation material and a same material of the first substrate or the second substrate.

17. The apparatus according to claim 13, wherein the reflective electrodes are disposed in the form of stripes or a mesh.

18. The apparatus according to claim 13, wherein the reflective electrodes are disposed in areas corresponding to emission areas of the respective sub-pixels.

19. The apparatus according to claim 18, wherein multiple ones of the plurality of reflective electrodes are disposed in each of the emission areas of the respective subpixels and are spaced away from each other in each of the emission areas.

20. The apparatus according to claim 13, wherein the electrode layer includes a transparent conductive material.

21. The apparatus according to claim 13, further comprising a color filter layer disposed in at least one sub-pixel of the plurality of sub-pixels and disposed between the separation layer and the reflective electrode of the at least one sub-pixel.

22. The apparatus according to claim 13, further comprising a reflective electrode non-disposition area in at least one sub-pixel of the plurality of sub-pixels.

23. The apparatus according to claim 13, wherein the organic light emitting element includes a first electrode, an organic emission layer disposed on the first electrode, and a second electrode disposed on the organic emission layer, and wherein the first electrode includes a reflective layer.

24. The apparatus according to claim 13, wherein the organic light emitting element is disposed in each of a plurality of sub-pixels or the organic light emitting element is disposed in the entire sub-pixels.

* * * * *